(12) United States Patent
Brazis et al.

(10) Patent No.: US 7,492,604 B2
(45) Date of Patent: Feb. 17, 2009

(54) ELECTRONIC MODULE INTERCONNECTION APPARATUS

(75) Inventors: Paul W. Brazis, South Elgin, IL (US); Marc K. Chason, Schaumburg, IL (US); Daniel R. Gamota, Palatine, IL (US); Krishna Kalyanasundaram, Elmhurst, IL (US)

(73) Assignee: Motorola, Inc., Schaumburg, IL (US)

( * ) Notice: Subject to any disclaimer, the term of this patent is extended or adjusted under 35 U.S.C. 154(b) by 330 days.

(21) Appl. No.: 11/379,751

(22) Filed: Apr. 21, 2006

(65) Prior Publication Data

US 2007/0247824 A1  Oct. 25, 2007

(51) Int. Cl.
*H05K 1/11* (2006.01)

(52) U.S. Cl. .............................. 361/784; 361/737
(58) Field of Classification Search ............ 361/736, 361/737, 752, 753, 784; 439/68, 69, 59; 257/777, 778, 779
See application file for complete search history.

(56) References Cited

U.S. PATENT DOCUMENTS 5,141,444 A * 8/1992 Redmond et al. ............. 439/59
6,252,791 B1 6/2001 Wallace et al.
6,780,733 B2 * 8/2004 Chason et al. ............... 438/464
6,910,637 B2 * 6/2005 Hsieh et al. ................. 235/492
6,944,028 B1 * 9/2005 Yu et al. ..................... 361/737
6,975,016 B2 * 12/2005 Kellar et al. ................ 257/618
2006/0042827 A1 * 3/2006 Chou et al. ................. 174/255
2007/0223179 A1 * 9/2007 Cheng et al. ............... 361/600

FOREIGN PATENT DOCUMENTS

WO    2005/086011 A1    9/2005

* cited by examiner

*Primary Examiner*—Tuan T Dinh
*Assistant Examiner*—Yuriy Semenenko

(57) ABSTRACT

An electronic apparatus, includes a plurality of electronic modules, each having a maximum thickness of no more than 90 microns, each comprising a substrate having a two sided edge connection pattern. The electronic modules are arranged adjacent to each other. Each pad of a first set of connection pads on a first electronic module is conductively connected to an opposing pad of a second set of connection pads of a second electronic module. The first set of connection pads is separated from the second set of connection pads by electrically conductive material that is less than 15 microns thick.

5 Claims, 2 Drawing Sheets

ELECTRONIC MODULE INTERCONNECTION APPARATUS

FIELD OF THE INVENTION

The present invention relates generally to electronic module interconnection, and more specifically to printed circuit edge connection techniques.

BACKGROUND

Smart cards that are electronic devices of roughly the size and thickness of a credit card or less are well known. Conventional smart cards can include a processor, program read only memory, and may include non-volatile read-write memory, but many are without human input sensors or output devices. The functions of such devices range from personalizing a cell-phone to storing financial information, and typically require the smart card to be connected to a host device such as a cell phone or a monetary transaction device.

Also known are methods to fabricate substrates, each having a plurality of very thin integrated circuits incorporated thereon, that are so thin that at least two of them can fit into the thickness of a conventional credit card. While it has been suggested that two or more such substrates could be combined for use as a single credit card sized device, cost effective methods or means for achieving compatibility with standardized interconnection systems, while simultaneously preserving a very thin form factor, are not currently known.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate the embodiments and explain various principles and advantages, in accordance with the present invention.

Figure 1:
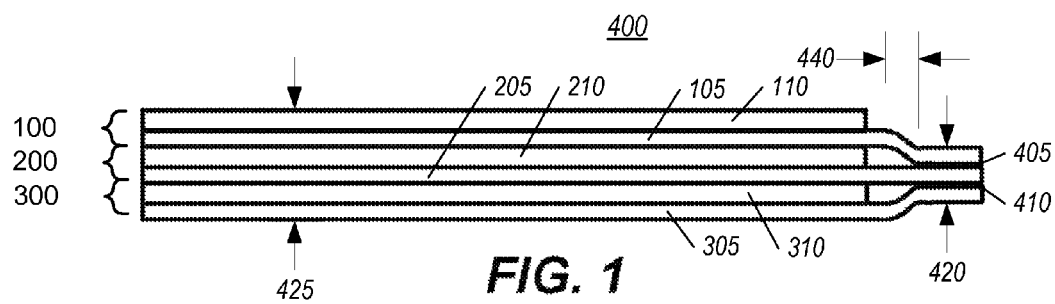
FIG. 1 is a cross sectional diagram that shows an electronic apparatus, in accordance with certain embodiments of the present invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Before describing in detail embodiments that are in accordance with the present invention, it should be observed that the embodiments reside primarily in combinations of method steps and apparatus components related to electronic module interconnection techniques. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

In this document, relational terms such as first and second, top and bottom, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Figure 2:
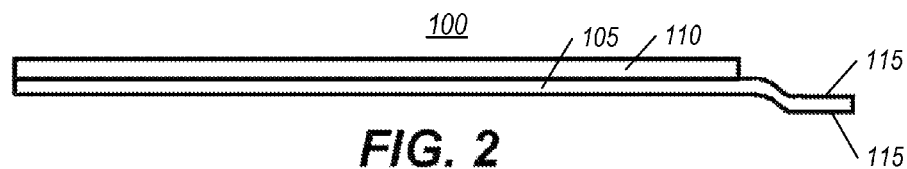
FIGS. 2, 3, and 4 are cross sectional diagrams that show electronic modules used in the electronic apparatus of FIG. 1, in accordance with certain embodiments of the present invention.
Figure 3:
Figure 4:
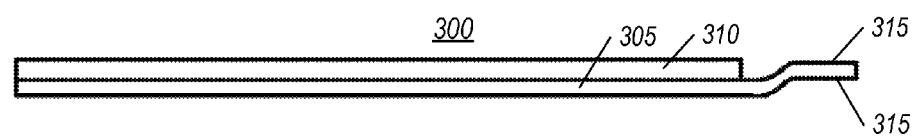

Referring to FIG. 1, a cross sectional diagram of an electronic apparatus 400 is shown, in accordance with certain embodiments of the present invention. The electronic apparatus 400 comprises a plurality of electronic modules, which in this example is three electronic modules. A first electronic module 100, a second electronic module 200, and a third electronic module 300 of these three electronic modules are shown individually in cross section diagrams in FIGS. 2, 3, and 4. Each of the electronic modules 100, 200, 300 is less than 90 microns thick, and each comprises a substrate 105, 205, 305. The substrates may comprise FR-4, polyimide flex material, BT, polyester, ceramic, or other organic polymers or paper-based materials. Each substrate comprises at least one solid state integrated circuit die that is flip chip mounted to the substrate, which in the exemplary embodiments illustrated herein are within a circuit region 110, 210, 310 of the respective electronic modules 100, 200, 300. The solid state integrated circuit die are thinner that those typically available from existing integrated circuit suppliers, but a process for producing thin flip chip die is well known from U.S. Pat. No. 6,780,733, entitled "Thinned Semiconductor Wafer and Die and Method therefore", issued on Aug. 24, 2004 to the assignee hereof. Each substrate 105, 205, 305 has a two sided edge connection pattern 115, 215, 315 that is not necessarily common to the three substrates; i.e., the connection pattern in some embodiments may be different for each substrate 105, 205, 305. The two sided edge connection pattern of each substrate of the plurality of electronic modules has a first set of connection pads on a first side and a second set of connection pads on a second side of the substrate.

Figure 5:
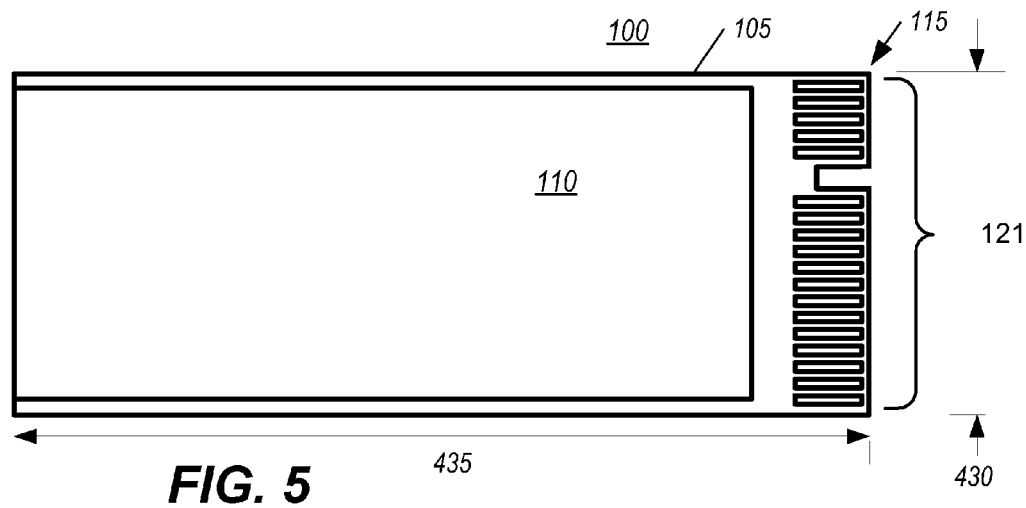
FIGS. 5 and 6 are plan views of a first side and a second side of one of the electronic modules used in the electronic apparatus of FIG. 1, in accordance with certain embodiments of the present invention.
Figure 6:
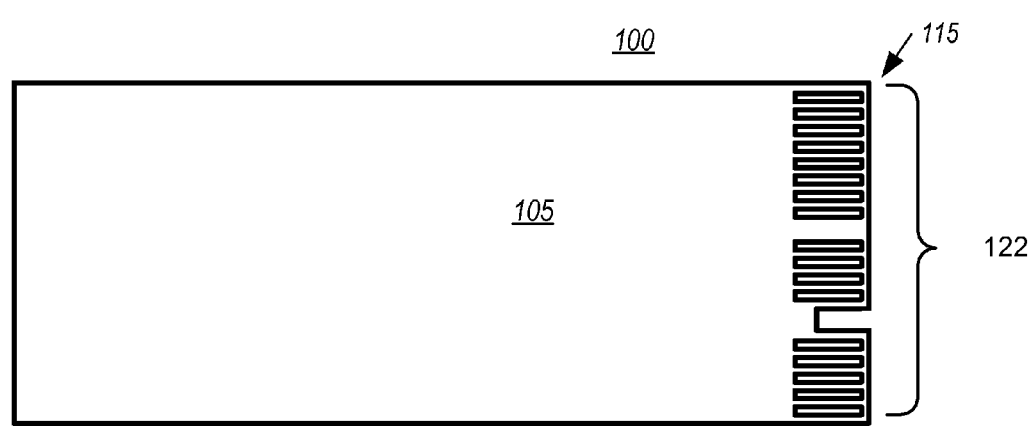

FIGS. 5 and 6, which are plan views of a first side and a second side of first electronic module 100, show examples of a first set of connection pads 121 and a second set of connection pads 122 of the two sided edge connection pattern 115 of the first electronic module 100, in accordance with certain embodiments of the present invention.

Figure 7:
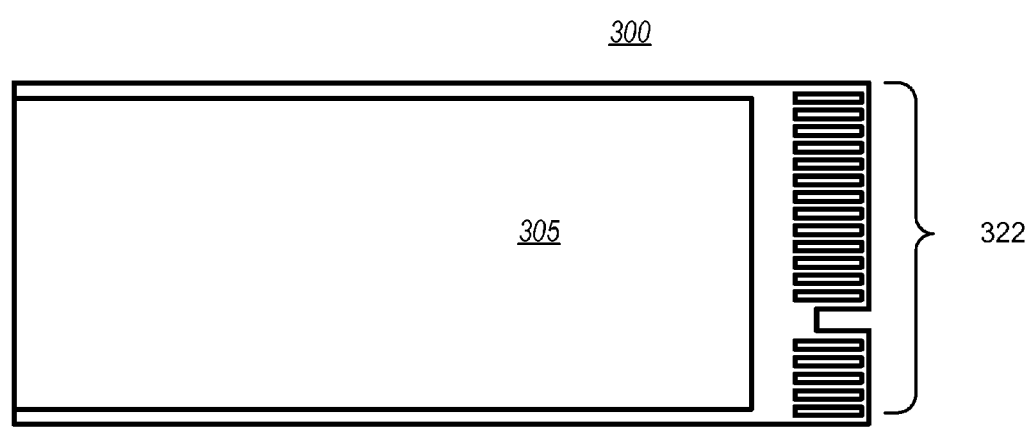
FIG. 7 is a plan view of a second side of one of the electronic modules used in the electronic apparatus of FIG. 1, in accordance with certain embodiments of the present invention.

FIG. 7, which is a plan view of a second side of the third electronic module 300, shows an example of a second set of connection pads 322 of the two sided connection pattern 315 of the third electronic module 300, in accordance with certain embodiments of the present invention. In this example, the second set of connection pads 322 does not have the same pattern as the second set of connection pads 122 shown in FIG. 6. In other embodiments, the second set of connection pads 322 of the third electronic module 300 may be the same pattern as the second set of connection pads 122 of the first electronic module 100, and the second set of connection pads 222 of the second electronic module 200 may be the same or different than either the second sets of connection pads of the first or third electronic modules.

As illustrated in FIG. 1, the plurality of electronic modules 100, 200, 300 are arranged adjacent to each other, and may be affixed to each other by adhesive means. Each adjacent pair (100, 200) (200, 300) of the plurality of electronic modules 100, 200, 300 is arranged with the first set of connections pads of one electronic module of the adjacent pair proximate a second set of connection pads of the other electronic module of the adjacent pair. In the example of FIG. 1, for the pair of electronic modules (100, 200), the first set of connection pads of second electronic module 200 is proximate the second set of connection pads of first electronic module 100. Each pad of the first set of connection pads is conductively connected directly to an opposing pad of the second set of connection pads of the second electronic module. "Conductively connected directly" means electrical conduction by a path that is not substantially longer than the separation between the pads, through a conductive material having a very high conductance, such as that of metallic or anisotropic conductors. Thus, it is evident that first and second sets of connection pads of a pair of adjacent electronic modules have the same layout when they are viewed in the adjacent arrangement of electronic modules. Furthermore, for each adjacent pair (100, 200) (200, 300) of the plurality of electronic modules 100, 200, 300, the first set of connection pads is separated from the second set of connection pads by conductive material that is typically less than 15 microns thick, and may be less than 5 microns thick. In the example of FIG. 1, for the pair of electronic modules (100, 200), the first set of connection pads 222 of second electronic module 200 is separated from the second set of connection pads 121 by conductive material that is less than 15 microns thick. In certain embodiments, the conductive material may be a highly conductive metal material, such as solder, that adheres each pair of opposing pads together. In certain other embodiments, the conductive material may be a material that has anisotropic conductive properties, such that the conductance is extremely low in the plane of the conductive pads, but very high in the direction perpendicular to the plane of the conductive pads (a ratio of such conductances is typically greater than $10^6$). For the edge connection patterns to be thus adhered necessitates, in typical embodiments, that some of the substrates 105, 205, 305 flex over an accommodation distance 440 (FIG. 1). This distance may be less for some types of substrate materials than others, and may extend into the circuit regions 110, 210, 310. The circuit regions 110, 210, 310 need not be all of the same size.

Figure 8:
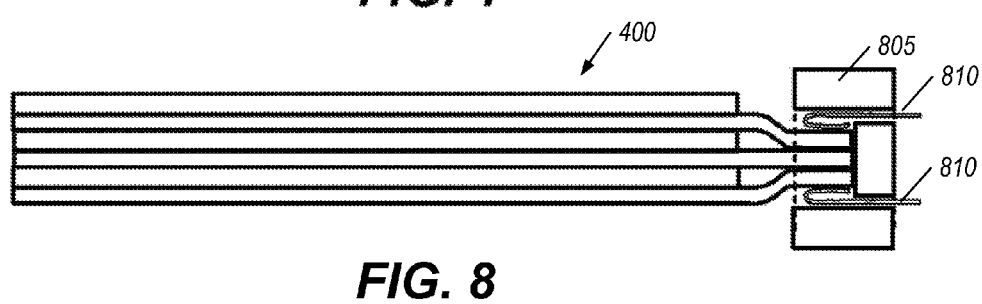
FIG. 8 is a cross sectional view that shows the electronic apparatus of FIG. 1 inserted into an edge connector, in accordance with certain embodiments of the present invention.

Referring to FIG. 8, a cross sectional view shows the electronic apparatus 400 inserted into an electrical connector 805, in accordance with certain embodiments of the present invention. The electrical connector 805 is of the type known as an edge connector, and has a plurality of edge connection terminals 810, of which two are illustrated in FIG. 8. One electronic module, the first electronic module 100, of the plurality of electronic modules 100, 200, 300 is designated a first outer electronic module. It is evident that this first outer electronic module 100 has a first set of outer connection pads that comprise the first set of connection pads 121, which is not proximate a second set of connection pads of any of the plurality of electronic modules 100, 200, 300. Another electronic module, the third electronic module 300, of the plural-ity of electronic modules 100, 200, 300 is designated a second outer electronic module. It is evident that this second outer electronic module 300 has a second set of connection pads that comprise the second set of connection pads 322 that is not proximate a first set of connection pads of any of the plurality of electronic modules. An edge connector average thickness 420 (FIG. 1) between pads of the first and second sets of outer connection pads and a total thickness 425 of the electronic apparatus (FIG. 1), a width 430 (FIG. 5), and a length 435 (FIG. 5) of the electronic apparatus may be compatible with a certain type of electronic apparatus that includes a certain type of edge connector 805. The edge connection structure formed by the first and second sets of outer connection pads may be called a resultant two sided edge connection pattern of the electronic apparatus 400, having a resultant thickness given by the average thickness 420 (FIG. 1). For example, the electronic apparatus may be a printed circuit board that connects to a flexible cable and the edge connector may be a standard flexible cable connector, for example, a zero insertion force connector that has opposing contacts on a pitch of 0.5 mm, and where opposing contacts are spaced to accommodate an edge connection pattern, such as found on an end of a flexible cable, having a thickness on the order of 30 microns up to thicknesses on the order of 300 microns. Such standard edge connectors, as the term is used in this document, may be connectors that meet physical standards promulgated by a standards organization, such as the International Telecommunications Union, or may meet an "ad hoc" standard, which means that the connector has physical characteristics that are available from several manufacturers but which may not be in standards documents promulgated by standards organizations, or may meet government (including military) standards. The size and arrangement of the first and second sets of outer connection pads of electronic apparatus 400 may be compatible with the certain type of edge connector. Furthermore, the signal characteristics provided by the electronics within the electronic apparatus and coupled to a portion of the first and second sets of outer connection pads may be defined by an industry standard or standards that also define the physical characteristics of the edge connector. (The portion may be as much as the entire set of connection pads.) Thus, the electronic apparatus 400 may be described as one that meets an industry standard because it meets industry standards for the physical characteristics of the edge connector and/or for electronic signal characteristics for signals coupled to the sets of outer connection pads, and/or for the physical size (e.g., total thickness 425, width 430, and length 435) of the electronic apparatus 400.

In certain embodiments, the electronic apparatus 400 comprises a plurality of electronic modules for which the two sided edge connection pattern of each electronic module is a pattern common to all of the plurality of electronic modules. Furthermore, in certain of these embodiments, the signals on each pair of opposing pads of the first and second sets of connection pads of each electronic module are common; which may be accomplished by metallic connection of each pair of opposing pads on each electronic module. This arrangement has an advantage that a plurality of different electronic module types may be designed, and differing sets of such electronic modules, having common two sided edge patterns with common signal definitions, may be combined to provide electronic apparatuses having different functionality, each of which can be inserted into the standard edge connector. For example, one combination may be a processing module and two cache memory modules, while another may be two processing modules and one cache memory module. In some embodiments, the electronic modules have a width and length (outline) that is common, and the width and length of each is thereby approximately equal to a width and length of the electronic apparatus. (Due to the bend that occurs in some modules to align the connection pads, the overall length of the electronic apparatus may be slightly larger than the fabricated length of some of the electronic modules). In some embodiments the outline of some modules may be smaller than other, except at the edge connection region, and therefore the outline of the electronic apparatus may be approximately equal to the outline of a largest module or some combination of modules.

Embodiments of the present invention can include electronic modules having a thickness of less than 90 microns (3.54 mils), and, in some embodiments having a thickness less than 55 microns (2.17 mils). Each electronic module may be made from a substrate having a thickness of less than 50 microns (1.97 mils), a thinned flip chip thickness of less than 25 microns (0.984 mils), and flip chip attachment material (e.g., conductive adhesive) thickness of less than 15 microns (0.591 mils). In some embodiments, the substrate may be less than 25 microns (0.984 mils) thick. Three such electronic modules when connected together may have a total thickness less than 270 microns (10.6 mils), and the resultant thickness 420 (FIG. 1) may be less than 180 microns (7.09 mils). In some embodiments, three such modules when connected together may have a total thickness less than 165 microns (6.50 mils) and the resultant thickness of the resultant two sided edge connection pattern may be less than 85 microns (3.35 mils). These embodiments may be designed, therefore, to provide three electronic modules that can be inserted in a standard edge connector and provide substantially more functionality than presently provided, while having an electronic apparatus total thickness and resultant two sided edge connector thickness that are compatible with standard edge connectors.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

The invention claimed is:

1. An electronic apparatus comprising:
   a first electronic module and a second electronic module, each having a maximum thickness of no more than 90 microns, each comprising at least one flip chip integrated circuit mounted on a substrate, wherein the substrate has an edge connection pattern comprising connection pads on each of a top side and a bottom side, the bottom side opposite the top side, of the substrate;
   wherein a first set of connection pads on the top side of the edge connection pattern of the first electronic module is separated from an opposing second set of connection pads on the bottom side of the edge connection pattern of the second electronic module by less than 15 microns,
   wherein each pad of the first set of connection pads is conductively connected directly to an opposing pad of the second set of connection pads,
   wherein the electronic apparatus has a resultant edge connection pattern comprising connection pads on the bottom side of the first electronic module and on the top side of the second electronic module, and
   wherein a thickness of the resultant edge connection pattern of the electronic apparatus is compatible with an edge connector, and wherein a size and arrangement of the pads of the resultant edge connection pattern are compatible with the edge connector.

2. The electronic apparatus according to claim 1 wherein physical characteristics of the edge connector are compatible with at least one of an industry standard and a government standard.

3. The electronic apparatus according to claim 1 wherein the edge connection pattern is a pattern common to the first and second electronic modules.

4. The electronic apparatus according to claim 1, wherein at least one of the conductive connections is provided by solder.

5. The electronic apparatus according to claim 1, wherein at least one of the conductive connections is provided by an anisotropic conductive material.

* * * * *